United States Patent
Hofstra et al.

(10) Patent No.: US 11,237,491 B2
(45) Date of Patent: Feb. 1, 2022

(54) REFLECTIVE OPTICAL ELEMENT FOR A RADIATION BEAM

(71) Applicant: ASML Netherlands B.V., Veldhoven (NL)

(72) Inventors: Ramon Mark Hofstra, Beekbergen (NL); Andrey Sergeevich Tychkov, Eindhoven (NL); Francois Charles Dominique Deneuville, Eindhoven (NL); Gerardus Hubertus Petrus Maria Swinkels, Eindhoven (NL); Petrus Adrianus Theodorus Maria Ruijs, Berghem (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 17/048,834

(22) PCT Filed: Apr. 10, 2019

(86) PCT No.: PCT/EP2019/059105
§ 371 (c)(1),
(2) Date: Oct. 19, 2020

(87) PCT Pub. No.: WO2019/206637
PCT Pub. Date: Oct. 31, 2019

(65) Prior Publication Data
US 2021/0165336 A1     Jun. 3, 2021

(30) Foreign Application Priority Data
Apr. 24, 2018   (EP) ..................................... 18169071

(51) Int. Cl.
*G03F 7/20*     (2006.01)
*G02B 27/14*    (2006.01)

(52) U.S. Cl.
CPC ....... *G03F 7/70891* (2013.01); *G02B 27/141* (2013.01); *G03F 7/702* (2013.01); *G03F 7/70033* (2013.01); *G03F 7/70266* (2013.01)

(58) Field of Classification Search
CPC .... G02B 27/141; G02B 7/181; G02B 7/1815; G03F 7/70033; G03F 7/70266;
(Continued)

(56) References Cited

U.S. PATENT DOCUMENTS 6,526,086 B1 *  2/2003  Wakabayashi ........ H01S 3/1055
                                                            250/225
7,473,878 B2    1/2009  Schrader et al.
(Continued)

FOREIGN PATENT DOCUMENTS

EP         2 343 586 A1      7/2011

OTHER PUBLICATIONS

International Search Report and Written Opinion of the International Searching Authority directed to related International Patent Application No. PCT/EP2019/059105, dated Aug. 13, 2019; 15 pages.
(Continued)

*Primary Examiner* — Christina A Riddle
(74) *Attorney, Agent, or Firm* — Sterne, Kessler, Goldstein & Fox P.L.L.C.

(57) ABSTRACT

A system comprises a reflective optical element with a reflective surface that is configured to reflect a radiation beam. The reflective optical element also has a body. The system includes a thermal conditioning mechanism operative to thermally induce a deformation of the body under control of a controller. By means of controllably deforming the body, the shape of the reflective surface can be adjusted in a controlled manner.

16 Claims, 8 Drawing Sheets

(58) Field of Classification Search
CPC ........ G03F 7/702; G03F 7/70891; G03F 7/70; G03F 7/70025; G03F 7/70041; G03F 7/70141; G03F 7/7015–70183; G03F 7/70191; G03F 7/70233; G03F 7/70308; G03F 7/70316; G03F 7/708; G03F 7/70808; G03F 7/7085; G03F 7/70858; G03F 7/70883; G03F 7/70941; G03F 7/7095; H05G 2/008; H01S 3/04–042
USPC ............................. 355/30, 52–55, 67–71, 77
See application file for complete search history.

(56) References Cited

U.S. PATENT DOCUMENTS

| | | | |
|---|---|---|---|
| 8,480,243 B2 | 7/2013 | Bruchmann et al. | |
| 2004/0036940 A1* | 2/2004 | Hazelton | G03F 7/70266 359/223.1 |
| 2004/0051984 A1* | 3/2004 | Oshino | G02B 7/008 359/845 |
| 2009/0122429 A1* | 5/2009 | Watson | G02B 7/008 359/846 |
| 2013/0020511 A1 | 1/2013 | Kameda et al. | |
| 2013/0063833 A1* | 3/2013 | Lemmen | G03F 7/70891 359/845 |
| 2013/0321926 A1* | 12/2013 | Bergstedt | G02B 27/141 359/634 |
| 2016/0010901 A1* | 1/2016 | Osuman | F25B 21/04 355/30 |

OTHER PUBLICATIONS

International Preliminary Report on Patentability directed to related International Patent Application No. PCT/EP2019/059105, dated Oct. 27, 2020; 11 pages.

* cited by examiner

REFLECTIVE OPTICAL ELEMENT FOR A RADIATION BEAM

CROSS-REFERENCE TO RELATED APPLICATIONS

This application claims priority of EP application 18169071.0 which was filed on 24 Apr. 2018 and which is incorporated herein in its entirety by reference.

FIELD

The present invention relates to a system configured to direct a radiation beam and including a reflective optical element. The invention further relates to a laser accommodating such system, to an optical amplifier accommodating such system, to a beam delivery system configured to guide a laser beam to a fuel target for creating a plasma, to a beam expander, to a beam compressor, to a separation system for providing separate paths for laser beams of different wavelengths, and to a reflective optical element.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern at a patterning device (e.g., a mask) onto a layer of radiation-sensitive material (resist) provided on a substrate.

To project a pattern on a substrate a lithographic apparatus may use electromagnetic radiation. The wavelength of this radiation determines the minimum size of features which can be formed on the substrate. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

The lithographic apparatus may comprise a radiation source operable to produce radiation (for example EUV radiation). The radiation source may be of the form of a laser produced plasma (LPP) source. The radiation source may, for example, comprise a laser system (which may, for example, include a $CO_2$ laser), arranged to deposit energy via a laser beam into a fuel so as to produce EUV radiation.

The laser system may be spatially separated from the radiation source. Where this is the case, the laser beam may be passed from the laser system to the radiation source with the aid of a beam delivery system comprising, for example, suitable directing mirrors and/or a beam expander, and/or other optics.

It may be desirable to provide laser delivery systems and/or optical elements for laser delivery systems that at least partially address one or more problems associated with prior art arrangements, whether identified herein or otherwise.

SUMMARY

According to a first aspect of the invention there is provided a system configured for directing a radiation beam. The system comprises a reflective optical element with a body defining a reflective surface configured for receiving and partially reflecting the radiation beam; a first thermal conditioning mechanism; a second thermal conditioning mechanism; and a controller. The first thermal conditioning mechanism is operative, during operational use of the system, to transport away from the body, heat generated by partial absorption of the radiation beam by the reflective optical element. The second thermal conditioning mechanism is operative, during operational use of the system, to control a shape of the reflective surface via thermally inducing a deformation of the body under control of the controller.

A second aspect of the invention relates to such system, wherein the first thermal conditioning mechanism comprises at least one first channel in the body configured for transporting a first cooling fluid through the body.

A third aspect of the invention relates to such system, wherein the second thermal conditioning mechanism comprises at least one of: a conduit in the body configured for transporting a thermal conditioning fluid through the body; a second thermo-electric element; and a light source operative to irradiate at least a part of a surface of the body.

Another aspect relates to such system, wherein the first thermal conditioning mechanism is operative to extract the heat, generated by partial absorption of the radiation beam, from a first portion of the body; the second thermal conditioning system is operative to control the shape via thermally inducing a deformation of a second portion of the body; and the second portion has a lower thermal conductivity than the first portion.

Another aspect relates to such system, wherein the body of the reflective optical element has a side other than adjacent the reflective surface and the side of the body has a non-flat profile when the body is not subjected to the thermally induced deformation. The side is configured to co-determine the thermally induced deformation of the body.

Another aspect relates to such system wherein the system includes a sensing system configured for sensing a characteristic of at least one of: the radiation beam incident on the reflective optical element; and the reflected radiation beam. The sensing system is configured to provide to the controller an output signal representative of the characteristic sensed.

The invention further relates to such system comprising at least one thermo-electric element configured to implement at least partly the first thermal conditioning mechanism as well as to implement at least partly the second thermal conditioning mechanism.

The invention also relates to a laser accommodating a system as described above, and to an optical amplifier accommodating a system as described above.

The invention further relates to a beam delivery system configured to guide a laser beam to a fuel target for interacting with the fuel target so as to create a plasma. The beam delivery system comprises a system as described above.

The invention also relates to a beam expander comprising a system as described above, and to a beam compressor comprising such system.

The invention further relates to a separation system configured for receipt, at a common input, of a first laser beam of a first wavelength and a second laser beam of a second wavelength different from the first wavelength. The separation system is configured to provide a first path through the separation system for the first laser beam, and a second path through the separation system for the second laser beam that is different from the first path. The separation system accommodates a system as described above. For example, a reflective optical element of the separation system includes a dichroic mirror.

The invention also relates to a combination comprising a reflective optical element and a second thermal conditioning system, the combination being configured for use in a system as described above.

The invention also relates to a lithographic apparatus configured for imaging a pattern onto a substrate via a radiation beam, the lithographic apparatus comprising a system as described above.

BRIEF DESCRIPTION OF THE DRAWINGS

Embodiments of the invention will now be described, by way of example only, with reference to the accompanying schematic drawings, in which.

DETAILED DESCRIPTION

Figure 1:
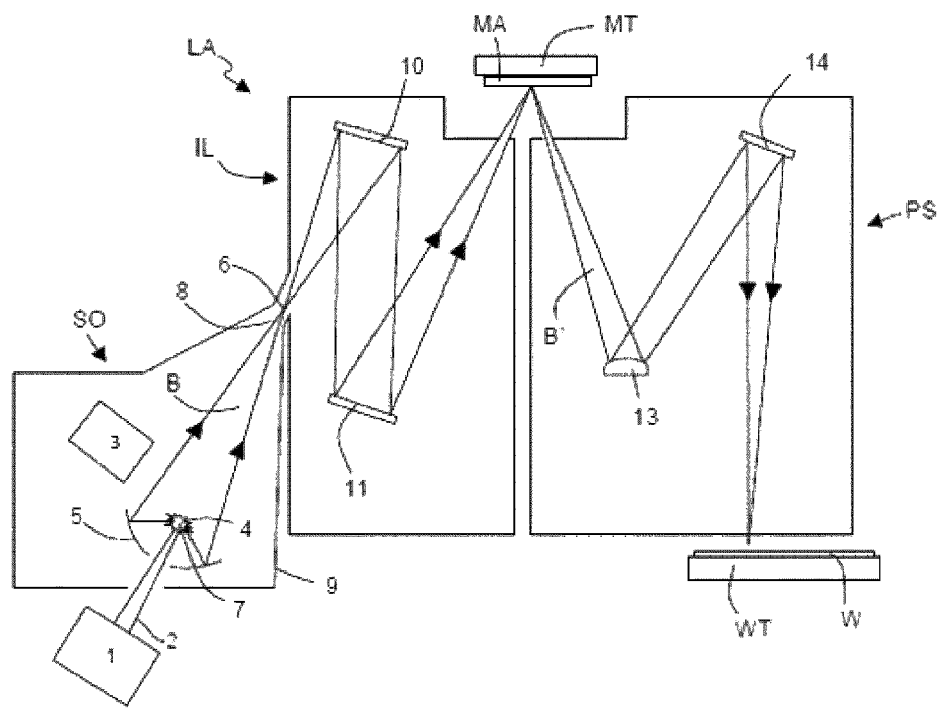
FIG. 1 depicts a lithographic system comprising a lithographic apparatus and a radiation source.

FIG. 1 shows a lithographic system comprising a radiation source SO and a lithographic apparatus LA. The radiation source SO is configured to generate an EUV radiation beam B and to supply the EUV radiation beam B to the lithographic apparatus LA. The lithographic apparatus LA comprises an illumination system IL, a support structure MT configured to support a patterning device MA (e.g., a mask), a projection system PS and a substrate table WT configured to support a substrate W.

The illumination system IL is configured to condition the EUV radiation beam B before the EUV radiation beam B is incident upon the patterning device MA. Thereto, the illumination system IL may include a facetted field mirror device 10 and a facetted pupil mirror device 11. The faceted field mirror device 10 and faceted pupil mirror device 11 together provide the EUV radiation beam B with a desired cross-sectional shape and a desired intensity distribution. The illumination system IL may include other mirrors or devices in addition to, or instead of, the faceted field mirror device 10 and faceted pupil mirror device 11.

After being thus conditioned, the EUV radiation beam B interacts with the patterning device MA. As a result of this interaction, a patterned EUV radiation beam B' is generated. The projection system PS is configured to project the patterned EUV radiation beam B' onto the substrate W. For that purpose, the projection system PS may comprise a plurality of mirrors 13,14 which are configured to project the patterned EUV radiation beam B' onto the substrate W held by the substrate table WT. The projection system PS may apply a reduction factor to the patterned EUV radiation beam B', thus forming an image with features that are smaller than corresponding features on the patterning device MA. For example, a reduction factor may be applied. Although the projection system PS is illustrated as having only two mirrors 13,14 in FIG. 1, the projection system PS may include a different number of mirrors (e.g., six or eight mirrors).

The substrate W may include previously formed patterns. Where this is the case, the lithographic apparatus LA aligns the image, formed by the patterned EUV radiation beam B', with a pattern previously formed on the substrate W.

A relative vacuum, i.e. a small amount of gas (e.g. hydrogen) at a pressure well below atmospheric pressure, may be provided in the radiation source SO, in the illumination system IL, and/or in the projection system PS. The pressure in the source SO may be different from the pressure in the illumination system IL or in the projection system PS.

The radiation source SO shown in FIG. 1 is, for example, of a type which may be referred to as a laser produced plasma (LPP) source. A laser system 1, which may, for example, include a $CO_2$ laser, is arranged to deposit energy via a laser beam 2 into a fuel, such as tin (Sn) which is provided from, e.g., a fuel emitter 3. Although tin is referred to in the following description, any suitable fuel may be used. The fuel may, for example, be in liquid form, and may, for example, be a metal or alloy. The fuel emitter 3 may comprise a nozzle configured to direct tin, e.g. in the form of droplets, along a trajectory towards a plasma formation region 4. The laser beam 2 is incident upon the tin at the plasma formation region 4. The deposition of laser energy into the tin creates a tin plasma 7 at the plasma formation region 4. Radiation, including EUV radiation, is emitted from the plasma 7 during de-excitation and recombination of electrons with ions of the plasma.

The EUV radiation from the plasma is collected and focused by a collector 5. Collector 5 comprises, for example, a near-normal incidence radiation collector 5 (sometimes referred to more generally as a normal-incidence radiation collector). The collector 5 may have a multilayer mirror structure which is arranged to reflect EUV radiation (e.g., EUV radiation having a desired wavelength such as 13.5 nm). The collector 5 may have an ellipsoidal configuration, having two focal points. A first one of the focal points may be at the plasma formation region 4, and a second one of the focal points may be at an intermediate focus 6, as discussed below.

The laser system 1 may be spatially separated from the radiation source SO. Where this is the case, the laser beam 2 may be passed from the laser system 1 to the radiation source SO with the aid of a beam delivery system (not shown) comprising, for example, suitable directing mirrors and/or a beam expander, and/or other optics. The laser system 1, the radiation source SO and the beam delivery system may together be considered to be a radiation system.

EUV radiation that is reflected by the collector 5 forms the EUV radiation beam B. The EUV radiation beam B is focused at intermediate focus 6 to form an image at the intermediate focus 6 of the plasma present at the plasma formation region 4. The image at the intermediate focus 6 acts as a virtual radiation source for the illumination system IL. The radiation source SO is arranged such that the intermediate focus 6 is located at or near to an opening 8 in an enclosing structure 9 of the radiation source SO.

Although FIG. 1 depicts the radiation source SO as a laser produced plasma (LPP) source, any suitable source such as a discharge produced plasma (DPP) source or a free electron laser (FEL) may be used to generate EUV radiation.

Some embodiments of the present invention relate to a reflective optical element that may form part of the laser system 1 and/or of a beam delivery system for delivering the laser beam 2 from the laser system 1 to the radiation source SO. In particular, some embodiments of the present invention relate to a reflective optical element that is provided with a mechanism for controlling a reflective surface of the reflective optical element, said reflective surface in use being arranged to receive and partially reflect a radiation beam (for example laser beam 2). Such a reflective optical element provides some control over a shape of a wavefront of the reflected laser beam. Examples of wavefront characteristics that may be controlled in this way include: tilt, defocus, spherical aberrations, coma and astigmatism. Alternatively, some embodiments of the present invention relate to a reflective optical element that may form part of the illumination system IL or of the projection system PS. The mechanism for controlling the shape of the reflective surface of the reflective optical element enables control over, e.g., the intensity distribution in a cross-section of the radiation beam, or of the divergence of the radiation beam or of the astigmatism or of other optical aberrations of the radiation beam, etc.

Figure 2:
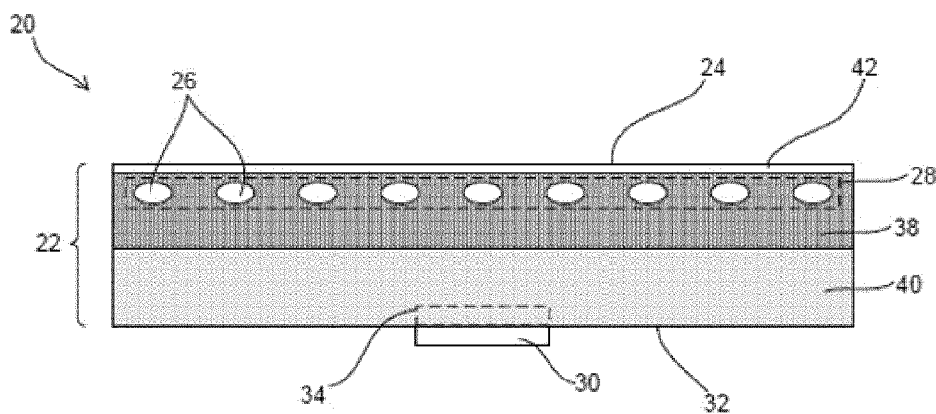
FIG. 2 is a schematic illustration of an embodiment of a reflective optical element according to an embodiment of the present invention.

A reflective optical element 20 according to an embodiment of the present invention is shown schematically in FIG. 2. The reflective optical element 20 comprises a body 22 defining a reflective surface 24 at the top for receiving and partially reflecting a radiation beam.

A plurality of channels 26 are formed in a first portion 28 of a first layer 38 of the body 22 for transporting a coolant such as, for example, water, through the body 22. In use, a radiation beam may be incident on, and reflected by, the reflective surface 24. Although the radiation beam may be generally reflected by the reflective surface 24 a fraction of the incident energy of the radiation beam is absorbed by the body 22. The plurality of channels 26 forms part of a cooling system that is arranged to absorb a heat load delivered to the reflective optical element 20 by the radiation beam (for example using coolant flowing through the channels 26) and to transport this heat load away from the body 22.

The plurality of channels 26 may be considered to form part of a first thermal conditioning mechanism that is arranged to control a temperature of the first portion of the body 28. It will be appreciated that the plurality of channels 26 may form part of a closed loop cooling system around which coolant (for example water) is pumped. As the coolant is pumped around the coolant system, it flows through the plurality of channels 26 and can absorb heat (for example a heat load produced by a radiation beam incident on the reflective optical surface 24). The coolant then flows out of the body 22 and the heat is removed from the coolant (for example using a heat exchanger) before the coolant re-enters the body 22.

The reflective optical element 20 is provided with a thermo-electric device 30. As known, a thermo-electric device is a solid-state device, whose operation is based on the Peltier effect: heating or cooling occurs at a junction of two different conductors when an electric current flows across the junction. Thermo-electric devices are known devices that have been widely used in thermal management applications and precise temperature control applications. In the example shown the thermo-electric device 30 is disposed on, and is in thermal contact with, a bottom surface 32 of the body 22. The thermo-electric device 30 is operable to exchange heat with a second portion 34 of a second layer 40 of the body 22. It will be appreciated that the second portion 34 of the body 22 is a portion of the body 22 which is adjacent to the thermo-electric device 30. The diagram of FIG. 2 shows the thermo-electric device 30 mounted on a flat bottom of the body 22. Alternatively, the body 22 may have a cavity (not shown) at the bottom to accommodate the thermo-electric device 30. The thermo-electric device 30 is operable to either deliver heat to the second portion 34 of the body 22 (so as to heat the second portion 34) or to extract heat from the second portion 34 of the body 22 (so as to cool the second portion 34). If the second portion 34 is heated, the second portion 34 will deform, e.g., by means of local expansion. The local expansion causes stress in the second layer 40 as a whole so that the second layer 40 will deform. If the second portion 34 is cooled, the second portion 34 will deform, e.g., by means of local contraction. The local contraction causes stress in the second layer 40 as a whole so that the second layer 40 will deform. The stress in the second layer 40 will induce a stress in the first layer 38 that, as a result, will also deform. This then leads to an associated deformation of the reflective surface 24. Accordingly, by properly positioning one or more thermo-electric devices at or within the second layer 40 and by proper control of the heat supplied or extracted via these thermo-electric devices, one controls the shape of the reflective surface 24.

The thermo-electric device 30 may be considered to form part of a second thermal conditioning mechanism which is arranged to thermally induce a deformation of the second layer 40 and, hence, a deformation of the first layer 38 and, therefore, eventually a deformation of the reflective optical surface 24. Accordingly, the first thermal conditioning mechanism is configured to provide a reference state of the shape of the reflective optical surface during operational use, and the second thermal conditioning mechanism is configured to controllably modulate the shape by controllably inducing a thermal deformation of the body 22.

The first portion 28 of the body 22 is closer to the reflective surface 24 than the second portion 34 of the body 22. The cooling channels in the first portion 28 remove the heat generated by absorption of the incident radiation and prevents the heat from diffusing towards the vicinity of the thermo-electric device 30 and, hence, from interfering with the intended thermally induced deformation brought about by the thermo-electric device 30.

The first and second thermal conditioning mechanisms of the reflective optical element 20 advantageously provide a mechanism by which the shape of the reflective surface 24 can be controlled, as now described. For example, by controlled thermally induced deformation of the second portion 34, being located at the center of the bottom 32, the reflective surface may be deformed so as to become more convex, as illustrated schematically in FIG. 3a, or more concave, as illustrated schematically in FIG. 3b.

The body 22 may be formed from any suitable material. Optionally, in some embodiments, the body 22 may be formed from a plurality of different layers, as now explained. In the embodiment shown in FIGS. 2, 3a and 3b, the body is formed from first and second layers 38, 40. The first layer 38 is formed from a first material and includes the first portion 28 of the body 22. The second layer 40 is formed from a second material and includes the second portion 34 of the body 22. The second material has a lower thermal conductivity than the first material, as now discussed.

The first layer 38 is disposed closer to the reflective surface 24 than the second layer 40. The first material may comprise a material with a high thermal conductivity such as, for example, copper. This may improve the efficiency with which a heat load delivered by the incident radiation beam to the reflective surface 24 can be removed (for example via coolant flowing through the plurality of channels 26). The second layer 40 may be formed from a material with a lower thermal conductivity than the first layer 38 such as, for example, steel. Advantageously, this reduces the amount of thermal power that should be supplied by, or removed by, the thermo-electric device 30 in order to maintain a given deformation.

The body 22 further comprises a third layer 42. The third layer is adjacent to the first layer 38 and defines the reflective optical surface 24. The third layer 42 may be formed from a material which has some suitable properties such as, for example, a relatively high reflectivity for a radiation beam that the reflective optical element 20 will, in operational use, be arranged to receive and reflect.

It will be appreciated that the reference state of the shape of the reflective surface 24 may have any desired shape. For example, the reference state of the shape of the reflective surface may be flat or may be curved (for example concave or convex).

In the embodiments described above with reference to FIGS. 2, 3a and 3b, the reflective optical element 20 comprises a single thermo-electric device 30, which is arranged to exchange heat with a single portion 34 of the body 22.

Such an arrangement may be suitable for controllably altering a global curvature of the reflective surface 24 so as, e.g., to alter a focusing power of the reflective optical element 20. Additionally or alternatively, such an arrangement may be suitable for providing at least some control over rotationally symmetric aberrations such as, for example, focus and spherical aberrations.

In alternative embodiments the reflective optical element 20 may comprise a plurality of thermo-electric devices, each of which is arranged to exchange heat with a different portion of the body 22. Collectively, the plurality of thermo-electric devices 30 may be considered to form part of a second thermal conditioning mechanism which is arranged to control a thermally induced deformation of the second portion of the body 22 (said second portion of the body comprising the plurality of different portions of the body that the thermo-electric devices are arranged to exchange heat with). Such embodiments are now described with reference to FIGS. 3c, and 4a to 5c.

Figure 3A:
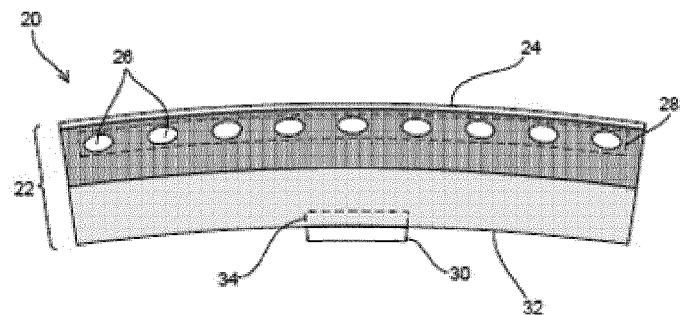
FIGS. 3a-3b show the reflective optical element of FIG. 2 having undergone thermally induced deformation.
Figure 3B:
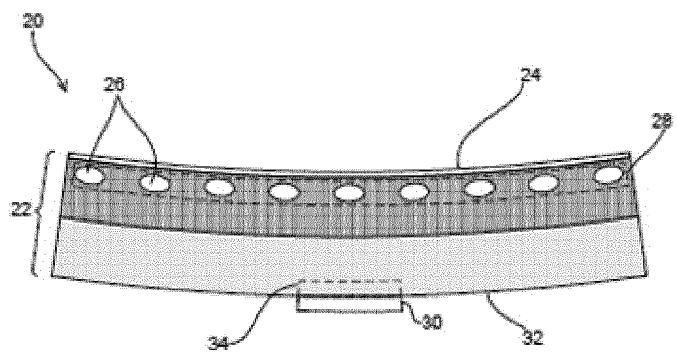
Figure 3C:
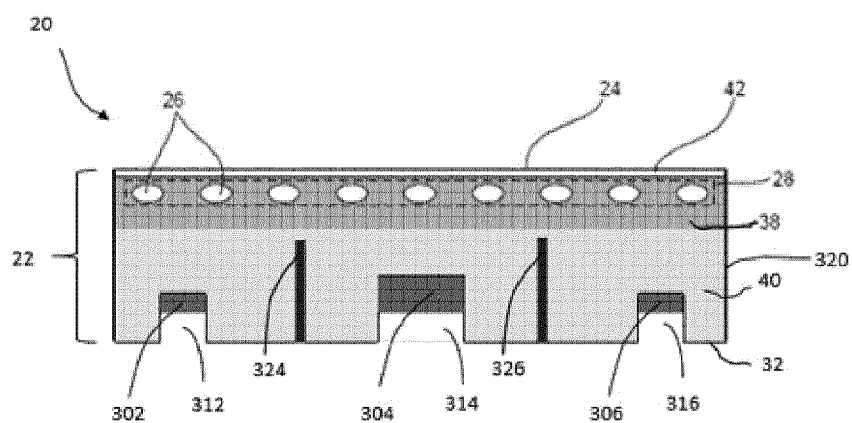
FIGS. 3c-3f show alternative embodiments of the reflective optical element according to the invention.

FIG. 3c schematically illustrates a reflective optical element 20 accommodating multiple thermo-electric devices, to wit a thermo-electric device 302, a thermo-electric device 304 and a thermo-electric device 306. The multiple thermo-electric devices may have different heating capacities or cooling capacities. For example, the thermo-electric device 302 and the thermo-electric device 306 have a heating capacity or cooling capacity that is lower than that of the thermo-electric device 306. Moreover, a thermo-electric device may be accommodated in a cavity of the second layer 40. For example, the thermo-electric device 302 is accommodated in a cavity 312, the thermo-electric device 306 is accommodated in a cavity 314 and the thermo-electric device 306 is accommodated in a cavity 316. In other embodiments of the reflective optical element 20 (not shown), one or more thermo-electric devices are accommodated in cavities, whereas one or more other thermo-electric devices are accommodated at the bottom and/or at a side wall of the reflective optical element 20, such as a sidewall indicated by reference numeral 320 in FIG. 3c. In still other embodiments (not shown) a thermo-electric device may be accommodated in, or at, at a local extension of the second layer 40 protruding downwards.

In the example of FIG. 3c, the reflective optical element 20 includes thermal insulators 324 and 326 configured to reduce cross-talk between the heating or cooling operations of neighboring ones of the thermo-electric devices. The thermal insulators are of a proper material that forms a mechanical bond with the material of the second layer 40 so as to be able to deform together with the second layer 40.

Note that one or more thermal insulators may also be used to confine the heating or cooling effect of a particular thermo-electric device to a particular region of the second layer 40, or to insulate another region of the second layer from the heating or cooling effect of one or more specific thermo-electric devices. This concept may also be applied to the configuration of the reflective optical element 20 of FIG. 2, having only a single thermo-electric device.

Accordingly, the designer of a reflective optical element 20 may specify a certain topography of the second layer 40, the number of thermo-electric devices, their heating or cooling capacities, their locations, and the positions of the thermal insulators in order to be able to create a reflective optical element 20 customized for thermally controlling the shape of the reflective surface 24 under pre-determined operational conditions.

The first thermal conditioning mechanism as discussed above, is configured to extract heat from the body 22 that is generated by part of the radiation beam that gets absorbed by the reflective optical element 20. The first thermal conditioning mechanism, illustrated in the diagrams of FIG. 2 and FIGS. 3a-3c, is implemented with a plurality of channels 26 that serve as conduits for a cooling fluid. However, the first thermal conditioning mechanism could, in principle, also be implemented with one or more thermo-electric devices that have been scaled to extract the heat generated in the body 22 as a result of absorption of part of the radiation beam incident on the reflective surface 24. Alternatively, the first thermal conditioning mechanism could, in principle, be implemented by a combination of one or more thermo-electric devices and channels for a cooling fluid.

As mentioned earlier, the second thermal conditioning mechanism is configured to controllably generate a thermally induced deformation of the body 22 so as to control the shape of reflective surface 24. The second thermal conditioning mechanism could therefore, in principle, be implemented by one or more additional fluid conduits for channeling a fluid through the second layer 40. The temperature of the fluid is controlled to effect a desired thermally induced deformation, i.e., a desired local expansion or a desired local contraction, of the portion of the body 22 in the vicinity of the relevant additional fluid conduit.

Figure 3D:
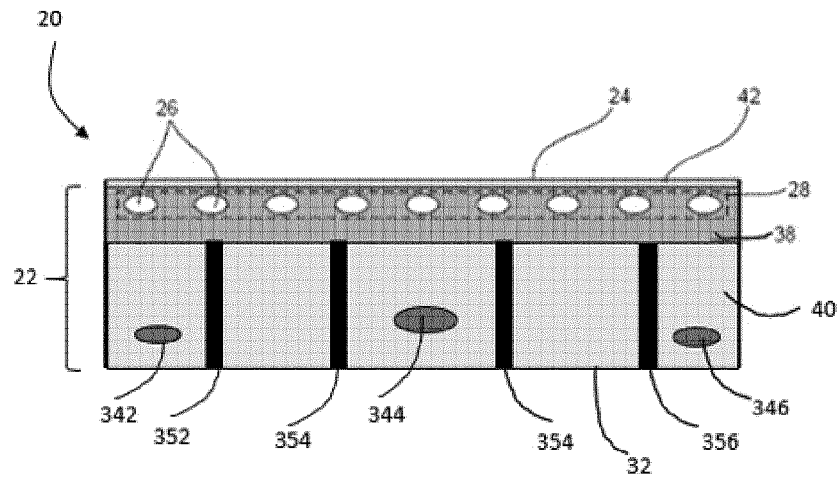
Figure 3E:
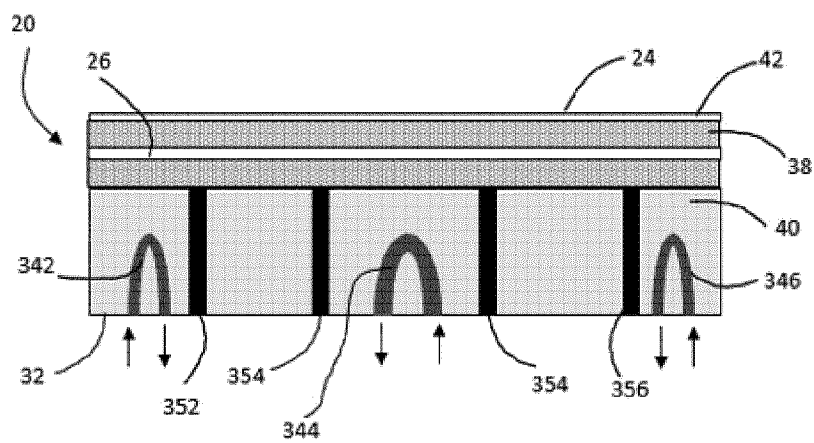

FIGS. 3d and 3e illustrate an example, wherein the second thermal conditioning mechanism is implemented using multiple such conduits accommodated within the second layer 40 of the body 22. FIG. 3d is a diagram of a cross-section of the reflective optical element 20 in a particular plane, here perpendicular to the channels 26. FIG. 3e is a cross-section of the reflective optical element 20 is another plane parallel to the channels 26. In the example shown, the second layer 40 accommodates a first conduit 342, a second conduit 344 and a third conduit 346. Different conduits may have different sizes, e.g., the second conduit 344 may have a larger heating or cooling surface than the first conduit 342 and larger than the third conduit 346. In the example of FIG. 3d, the second layer 40 accommodates thermal insulators 352, 354 and 356 so as to reduce cross-talk between the thermally induced deformation effects brought about by individual ones of the conduits. For completeness, it is remarked here that one more of the conduits may also be implemented by having external tubes mounted in thermal contact with specific locations at the bottom 32. Different conduits may be supplied with fluids having different temperatures.

Figure 3F:
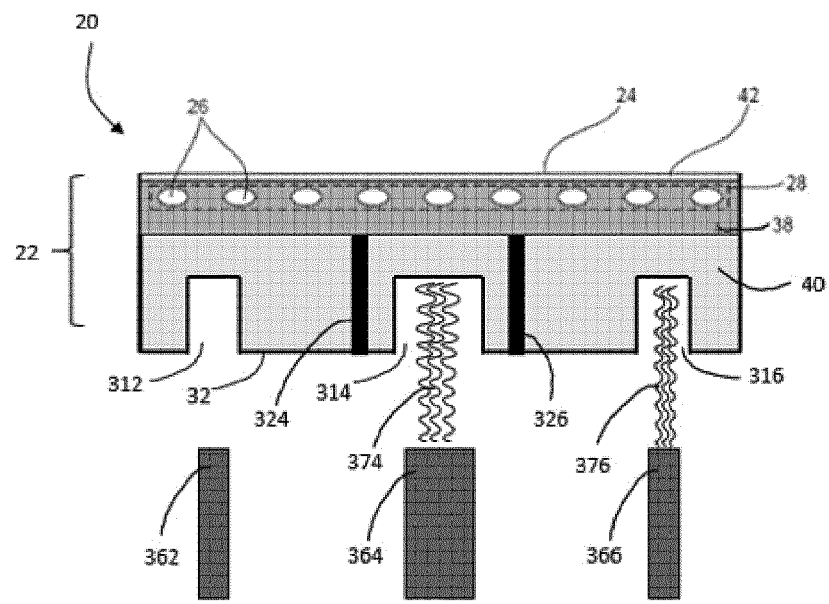

FIG. 3f illustrates an example, wherein the second thermal conditioning mechanism is implemented using multiple light sources, e.g., multiple lasers, configured to irradiate specific areas of the bottom 32 of the body 22 so as to heat up the portions of the body in the vicinity of these areas. In the example shown, the bottom 32 is formed with a first cavity 312, a second cavity 314 and a third cavity 316. The second thermal conditioning mechanism comprises a first laser 362, a second laser 364 and a third laser 366. The first laser 362 is configured to heat up the bottom of the first cavity 312. The second laser 364 is configured to heat up the bottom of the second cavity 314 and the third laser 366 is configured to heat up the bottom of the third cavity 316. In the diagram of FIG. 3f, the first laser 362 is inactive, whereas the second laser 364 is emitting a laser beam 374 and the third laser 366 is emitting another laser beam 376. Accordingly, only a central portion and a right-hand portion of the second layer 40 in the cross-section as depicted are heated as the first laser 362 is inactive. The dimensions of the cavities, e.g., their individual depths and individual widths, as well as the power, duty cycle, and cross-sections of the laser beams from the first laser 362, the second laser 364 and the third laser 366 determine the heat load and therefore the thermally induced deformation of the body 22.

Figure 4A:
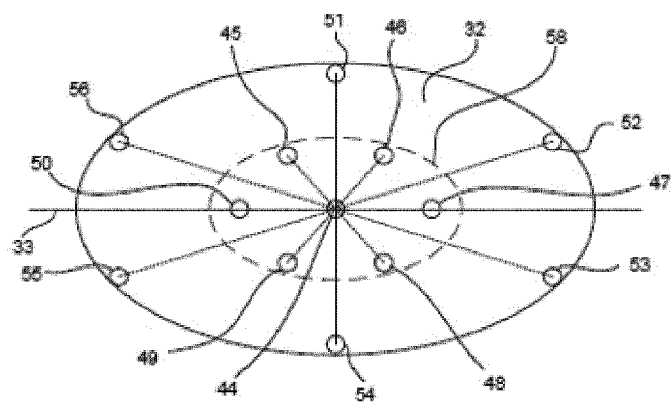
FIGS. 4a-4b illustrate a further embodiment of a reflective optical element in accordance with the invention.

FIG. 4a is a schematic representation of the bottom surface 32 of the body 22 in an example of a reflective optical element in the invention. Also shown are the positions of, in this example, thirteen thermo-electric devices 44-56. It is clear that any integer number of thermo-electric devices other than thirteen is feasible and that positions other than the ones shown can be used. The thermo-electric devices 44-56 are disposed on, and are in thermal contact with, the bottom surface 32 of the body 22. Each specific one of the thermo-electric device 44-56 is operable to exchange heat with a portion of the body 22 which is adjacent to that specific thermo-electric device. It will be appreciated that each thermo-electric device is operable to either deliver heat to a portion of the body 22 (so as to heat that portion) or to extract heat from that portion of the body 22 (so as to cool that portion).

Figure 4B:
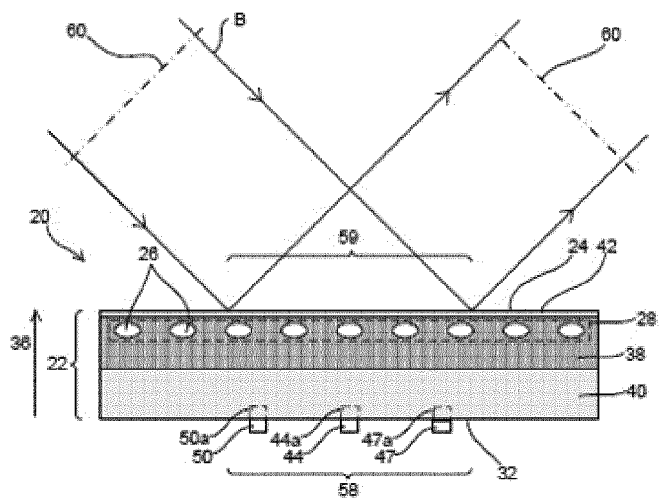

FIG. 4b is a schematic representation of a cross-section of the body 22 of the reflective optical element 20 shown in FIG. 4a. In particular, the cross-section is through a plane indicated in FIG. 4a by line 33. This plane intersects three of the thermo-electric devices 50, 44, 47 and the associated portions 50a, 44a and 47a adjacent a relevant one of the thermo-electric devices 50, 44 and 47.

Such an arrangement having multiple thermo-electric devices provides greater control over the thermally induced deformation of the body 22 and, therefore, over the shape of the reflective surface 24. Such an arrangement can allow higher-order optical aberrations of a radiation beam incident on the reflective surface 24 to be controlled, as now discussed with reference to FIGS. 5a-5c.

Also shown in FIGS. 4a and 4b is a region 58 of the bottom surface 32 which generally corresponds to a region 59 of the reflective surface 24 on the top side which in use receives the radiation beam. The region 59 is also shown in FIG. 4b. Here it will be appreciated that a position on the bottom surface 32 generally corresponds to a position on the reflective surface 24 which is separated thereby by the direction 36 but which is at substantially the same position in a plane perpendicular to that direction 36. The region 58 of the bottom surface 32 which generally corresponds to a region 59 of the reflective surface 24 is generally elongated, e.g., elliptical. In use, the reflective surface 24 may receive a generally circular radiation beam B (see FIG. 4b) at a non-zero angle of incidence such that the radiation beam irradiates such an elliptical beam spot region. With such an arrangement, the radiation beam B will be generally circular in cross-section in planes 60 that are perpendicular to the propagation direction of the radiation beam B. Such a plane 60 that is perpendicular to the propagation direction of the radiation beam B may be referred to herein as a pupil plane.

A first thermo-electric device 44 is disposed in the center of the region 58 of the bottom surface 32.

A first set of six thermo-electric devices 45-50 is disposed inside the region 58. The six thermo-electric devices 45-50 are arranged in a generally hexagonal configuration, i.e., spaced apart in an angular direction by 600, and are proximate to a boundary of the region 58.

A second set of six thermo-electric devices 51-56 is disposed outside the region 58. The six thermo-electric devices 51-56 are arranged in a generally hexagonal configuration, spaced apart in an angular direction by 600. The second set of six thermo-electric devices 51-56 forms a configuration, rotated relative to the first set of six thermo-electric devices 45-50.

With arrangements such as the embodiment shown in FIGS. 4a and 4b, having a plurality of thermo-electric devices, a range of different thermally induced deformations of the reflective surface 24 are possible. If the radiation beam B is a laser beam, this arrangement provides control over, e.g., the shape of the wavefront of the radiation beam B via control of the reflective surface 24. For a radiation beam B in general, this arrangement provides control over, e.g., a divergence or convergence of the reflected beam or over a spatial distribution of the intensity in a cross-section of the reflected beam.

Figure 5A:
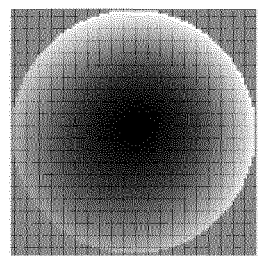
FIGS. 5a-5c illustrate thermally induced deformations of the reflective surface of a reflective optical element according to the invention.
Figure 5B:
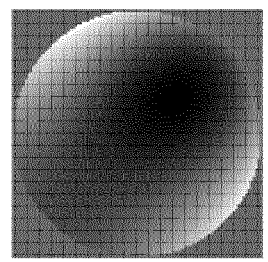
Figure 5C:
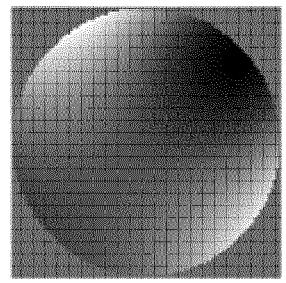

FIGS. 5a to 5c each show, by way of example, deformations of the region 59 of the reflective surface 24 that can be achieved by supplying or extracting heat via the thermo-electric devices 44-56. The FIGS. 5a to 5c are based on measurements of the deformations of the reflective surface 24 using an interferometer. It will be appreciated that the deformation of the region 59 of the reflective surface 24 which is shown in FIGS. 5a to 5c is a geometric projection of the (generally elliptical) beam spot region 59 onto a pupil plane 60 (such that the beam spot region 59 of the reflective surface 24 appears to be generally circular).

FIG. 5a shows the deformation of the region 59 that can be achieved by providing heat to the thermo-electric device 44 at the center of the region 58 of the bottom surface 32, keeping the other thermo-electric devices inactive.

FIG. 5b shows the deformation of the region 59 that can be achieved by providing heat to a single one of the first set of thermo-electric devices 45-50 and keeping the other thermo-electric devices inactive.

FIG. 5c shows the deformation of the region 59 that can be achieved by providing heat via a single one of the second set of thermo-electric devices 51-56.

The diagrams of FIGS. 5a to 5c each indicate in grayscale the magnitude of the deformation of the reflective surface 24. For example, in the diagram of FIG. 5a, the deformation is brought about by heating the body 22 only via the thermo-electric device 44 at the center of the region 58. FIG. 3*a* indicates this type of deformation with respect to the shape of the reflective optical element 20 of FIG. 2. The gray scale in FIG. 5*a* then shows a deformation whose magnitude gets larger going from the center to the edge.

It will be appreciated that with using different combinations of the thermo-electric devices 44-56 many different deformations are possible. When one of the thermo-electric devices 44-56 is exchanging heat with (i.e. heating or cooling) a portion of the body 22 it may be referred to as being operational. For example, each of the thermo-electric devices 44-56 could be arranged to exchange heat with an associated portion of the body 22 while the remaining other thermo-electric devices 44-56 are not exchanging heat with the body 22. Similarly, different deformations can be achieved by having different combinations of more than one of the thermo-electric devices 44-56 being operational. Furthermore, these deformations could be adjusted by adjusting the magnitude of the power of heat exchange between individual ones of the operational thermo-electric devices 44-56 on the one hand, and the body 22 on the other hand.

The thirteen deformations that can be achieved having only a single one of the thermo-electric devices 44-56 operational (while the remaining other ones of the thermo-electric devices 44-56 are not operational) may be considered to form a set of basis deformations. A general deformation may be considered a linear combination of two or more basis deformations, at least by approximation. It will be appreciated that these basis deformations may not form a complete set and, therefore, it may not be possible to generate all possible deformations. It will be further appreciated that a greater number of thermo-electric devices will allow for a greater range of different deformations to be generated.

It may be convenient to construct a matrix, describing the deformation of the reflective surface of the reflective optical element, formed with N individual basis deformations, the integer N being the number of individual thermo-electric devices (or equivalents, such as the illumination sources and additional conduits described with reference to FIG. 3*f* and FIGS. 3*d*-3*e*, respectively). A desired deformation can be constructed, or at least be approximated, by applying individual coefficients (individual weighting factors) to the individual basis deformations in a linear combination. The coefficients can be determined, for example, by a mathematical method. Such a method maybe the pseudo-inverse or based on the singular value decomposition.

Some embodiments of the present invention relate to methods for controlling a wavefront of a laser beam using a reflective optical element, which may generally be of the form of the reflective optical elements 20 described above.

The method may comprise determining a wavefront of the laser beam. The method may further comprise determining from the determined wavefront of the laser beam and from a desired wavefront of the laser beam a desired shape of a reflective surface of the reflective optical element that will achieve the desired wavefront following reflection from the reflective surface. The method may further comprise; controlling the reflective surface of the reflective optical element so as to create said desired wavefront shape. The controlling of the reflective surface of the reflective optical element may then be achieved by thermally inducing a deformation of the body of the reflective optical element, for example, via operating one or more of the thermo-electric devices accommodated at the reflective optical element, and/or irradiating specific portions of the body with dedicated light sources and/or supplying heat loads or extracting heat loads from particular regions in the body 22.

Determining a shape of a reflective surface of the reflective optical element from the determined wavefront of the laser beam and a desired wavefront of the laser beam may comprise: determining a target or desired deformation of the reflective surface, the target or desired deformation being dependent on the determined wavefront of the laser beam and a desired wavefront of the laser beam. For example, the target or desired deformation may be proportional to a difference between the shape of the determined wavefront and the shape of the desired wavefront.

Determining a shape of a reflective surface of the reflective optical element from the determined wavefront of the laser beam and a desired wavefront of the laser beam may further comprise determining a linear combination of basis responses, each of which achievable by having only one of the thermo-electric devices operational. Similar considerations apply in case one or more conduits for a thermally conditioning fluid are being used instead of one or more thermo-electric devices, to controllably heat or cool the body 22, as described with reference to FIGS. 3*d* and 3*e* above. Likewise, similar considerations apply in case one or more lasers are being used, instead of one or more thermo-electric devices, to controllably heat the body 22, as described with reference to FIG. 3*f* above. Similar considerations also apply to a case wherein the second thermal conditioning mechanism includes a heterogenous combination of thermos-electric devices, one or more lasers and one or more conduits per reflective optical element.

As previously explained, the reflective optical element 20 described above may form part of the laser system 1 and/or a beam delivery system for delivering the laser beam 2 from the laser system 1 to the radiation source SO. Alternatively, the reflective optical element 20 may form part of the illumination system IL or part of the projection system PS illustrated in FIG. 1.

Some embodiments of the present invention will now be discussed with reference to FIGS. 6 and 7.

For completeness it is remarked here that the embodiments discussed in the following with reference to FIGS. 6-12, include the first thermal conditioning mechanism as well, although this mechanism may not explicitly be indicated in the diagrams or addressed in the text. As specified above, the first thermal conditioning mechanism is configured to extract the heat generated in the body of the reflective optical element owing to absorption of the radiation beam incident on the reflective surface.

Figure 6:
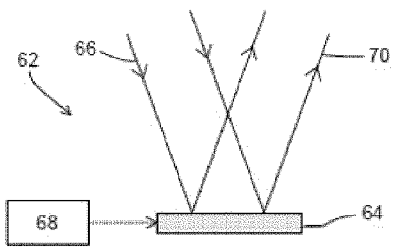
FIG. 6 shows a first system according to an embodiment of the present invention.

FIG. 6 shows a first system 62, which comprises a reflective optical element 64 and a control system 68. The reflective optical element 64 is configured for reflecting a laser beam 66 (for example the laser beam 2) so as to form a reflected laser beam 70. The control system 68 is configured for control of the thermally induced deformation in a body of the reflective optical element 64 so as to control a shape of a wavefront of the reflected laser beam 70.

Such a system 62 provides control over the wavefront of the laser beam 70 via control of the deformation of a shape of the reflective optical element 64. Examples of wavefront characteristics that may be controlled using the system 62 include: tilt, convergence or divergence, spherical aberrations such as coma and astigmatism, etc.

It will be appreciated that the reflective optical element 64 may be generally of the form of the reflective optical elements 20 described above.

In some embodiments, the system may comprise a plurality of such reflective optical elements.

Figure 7:
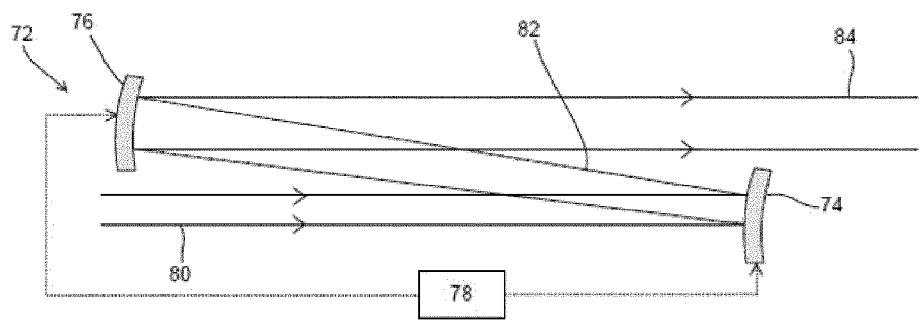
FIG. 7 shows a second system according to an embodiment of the present invention.

FIG. 7 shows a second system 72, which comprises a first reflective optical element 74, a second reflective optical element 76 and a control system 78. The first reflective optical element 74 is configured for reflecting a radiation beam 80 so as to form a reflected radiation beam 82.

The second reflective optical element 76 is configured to receive the reflected radiation beam 82 (that has been reflected by the first reflective optical element 74) and for reflecting the reflected radiation beam 82 so as to form an output radiation beam 84.

The control system 78 is configured for control of a thermally induced deformation of a body of at least one of the first reflective optical element 74 and the second reflective optical elements 76 so as to control a size of the output radiation beam 84.

It will be appreciated that the first and second reflective optical elements 74, 76 may be generally of the form of the reflective optical elements 20 described above.

It will be appreciated that as used in this context the second reflective optical element 76 being configured to receive the radiation beam 82, which has been reflected by the first reflective optical element 74, is intended to include situations, wherein the second reflective optical element 76 is configured to receive the reflected radiation beam 82 directly, as well as situations, wherein the second reflective optical element 76 is configured to receive the reflected radiation beam 82 indirectly (for example via one or more intermediate optical elements—not shown).

The first reflective optical element 74 is convex and the second reflective optical element 76 is concave. Therefore, the system 72 forms a beam expander that is operable to produce an output radiation beam 84 that is larger in cross-section than the incident radiation beam 80. It will be appreciated that in alternative embodiments the first reflective optical element 74 may be concave and the second reflective optical element 76 may be convex such that the output radiation beam 84 is smaller in cross-section than the incident radiation beam 80. Then the system 72 forms a beam compressor.

Although the above described embodiments of reflective optical elements 20 comprise a first thermal conditioning mechanism comprising a plurality of channels 26 and a second thermal conditioning mechanism comprising one or more thermo-electric devices, in general each of the first and second thermal conditioning mechanisms may comprise any suitable mechanism for controlling a temperature of part of the body.

For example, the second thermal conditioning mechanism may comprise a light source, the light source being configured to increase a temperature of the second portion by illuminating it. It will be appreciated that here the light source is intended to mean a light source that forms part of, or is associated with, the reflective optical element and which provides some level of control over the temperature of the second portion. As another example, consider the second thermal conditioning mechanism, configured to controllably deform the body 22 so as to control the shape of reflective surface 24. The second thermal conditioning mechanism could, in principle, be implemented by additional fluid conduits Some other embodiments of the present invention also relate to a system configured to direct a laser beam, as now discussed with reference to FIGS. 8 and 9.

Figure 8:
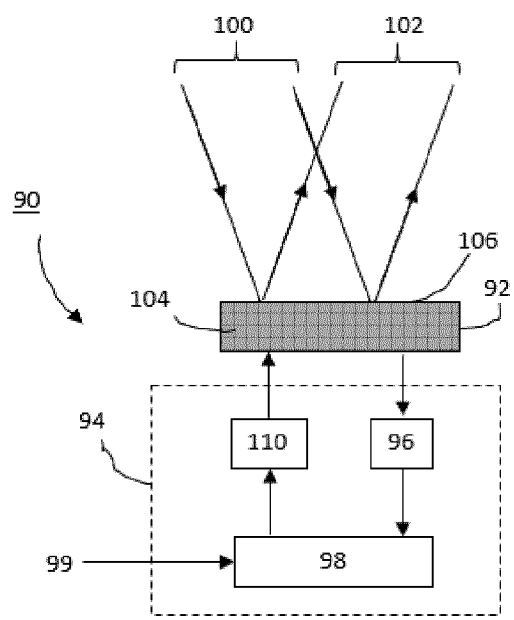
FIG. 8 shows a third system according to an embodiment of the present invention.

FIG. 8 shows a third system 90, which comprises a reflective optical element 92, similar to reflective optical element 20 discussed above. The third system 90 comprises a thermal conditioning mechanism 94, a temperature sensing system 96 and a controller 98. The thermal conditioning mechanism 94 is similar to the second thermal conditioning mechanism, discussed above as configured to thermally induce a deformation in a body 104 of reflective optical element 92 and, hence, in a reflective surface 106 of the reflective optical element 92. The reflective optical element 92 is configured for reflecting a radiation beam 100 (for example the laser beam 2) so as to form a reflected radiation beam 102.

The thermal conditioning mechanism 94 comprises a thermal actuation system 110 that includes one or more thermo-electric devices.

The temperature sensing system 96 is operable to sense one or more temperatures in the body 104 that are indicative of the local thermally induced deformation at one or more regions in the body 104 of the reflective optical element 92.

The controller 98 receives a signal representative of the one or more temperatures sensed by the sensing system 96. The controller 98 is operable to control the thermal actuation system 110 in dependence on the signal received from the sensing system 96.

The system 90 operates to control the shape of a reflective surface 106 of the reflective optical element 92 and, therefore, some properties of the radiation beam 102 after it has been reflected by the reflective optical element 92. The controller 98 may receive a signal 99 indicative of a setpoint of the desired shape of the reflective surface 106, e.g., in terms of a desired temperature distribution within the body 104 that, in turn, is representative of the desired deformation of the reflective surface 106.

Some embodiments of the present invention may relate to systems comprising a plurality of reflective optical elements of the type discussed above. Such an embodiment is now described with reference to FIG. 9.

Figure 9:
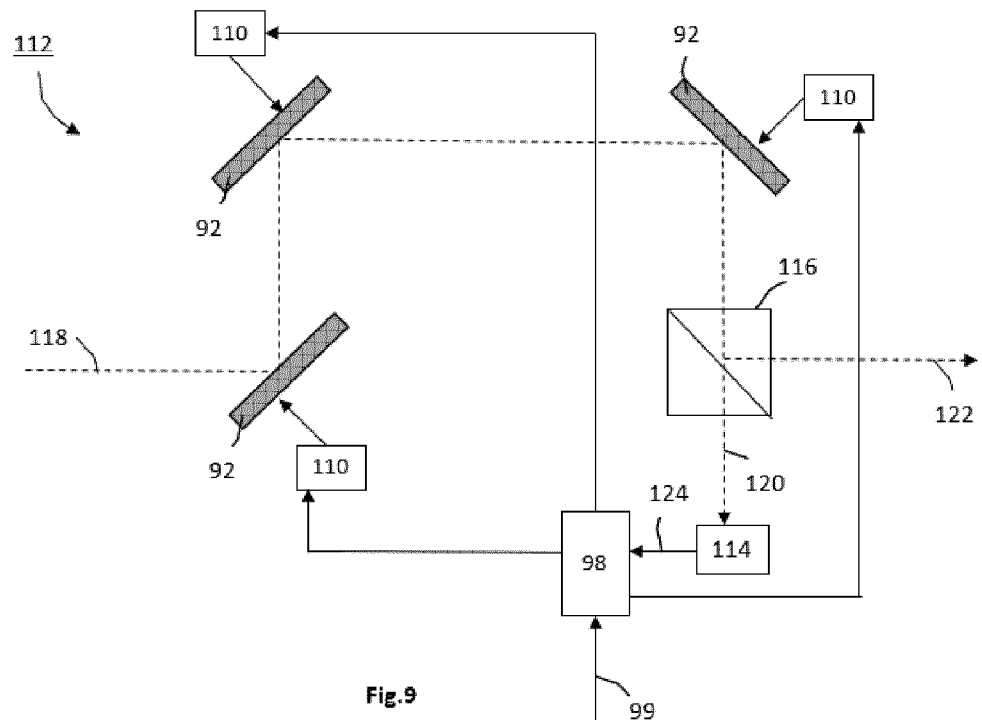
FIG. 9 shows a fourth system according to an embodiment of the present invention.

FIG. 9 shows a fourth system 112, which comprises three reflective optical elements 92, a sensing system 114 and a controller 98. Each of the three reflective optical elements 92 is generally of the form of the reflective optical element 92 described above with reference to FIG. 8 and is provided with an associated thermal actuation system 110. Again, each the thermal actuation system 110 may generally include an embodiment with one or more thermo-electric devices as discussed above with reference to FIG. 2, FIGS. 3a-3c, and FIGS. 4a-4b. In an alternative embodiment, each thermal actuation system 110 may include additional fluid conduits as discussed above with reference to FIGS. 3d-3e. Alternatively, each thermal actuation system 110 may include an embodiment with one or more light sources as discussed above with reference to FIG. 3f. As also discussed above, a specific one of the thermal actuation systems 110 shown may include any combination of thermo-electric elements, additional fluid conduits and light sources. Different ones of the thermal actuation systems 110 shown in FIG. 9 may be implemented with different embodiments.

The fourth system 112 further comprises a beam splitter 116. The reflective optical elements 92 are configured for reflecting a radiation beam 118 (for example the laser beam 2) and are arranged such that the radiation beam 118 is reflected by each reflective optical element 92 in turn and is then incident on the beam splitter 116. A first part 120 of the radiation beam incident on the beam splitter 116 is directed to the sensing system 114 and a second part 122 of the radiation beam incident on the beam splitter 116 is directed to form an output radiation beam of the fourth system 112.

The sensing system 114 is operable to determine one or more characteristics of the first part 120 of the radiation beam incident on the beam splitter 116. It will be appreciated that from the sensed characteristics of the first part 120, one or more characteristics of the second part 122, i.e., of the output radiation beam, may be inferred. An example of a characteristic is a spatial intensity distribution of the first part 120 that can be sensed via a camera (not shown). Another example of a characteristic is a wavefront of the first part 120 that can be sensed via a wavefront sensor such as a Shack-Hartmann wavefront sensor. Other examples of a characteristic are a size of the radiation beam incident on the beam splitter 116, which can be sensed via a camera, and a position of the radiation beam 122 relative to a pre-determined reference position that can be sensed via an array of photo-diodes, etc.

The controller 98 is operable to control the thermal actuation systems 110 associated with the reflective optical elements 92 in dependence on a signal 124 received from the sensing system 114 that is indicative of one or more characteristics of the first part 120 as sensed by the sensing system 114.

For example, the sensing system 114 may be operable to measure the size and divergence of the first part 120, from which a beam size and divergence of the second part 122 can be inferred. In turn, the controller 98 may be operable to control the thermal actuation systems 110 of each of the reflective optical elements 92 in dependence on a signal 124 received from the sensing system 114 in order to maintain a beam size and/or focus of the second part 122 at setpoint values received via an input 99. This maintaining of the beam size and/or focus is accomplished through controlling the shape of the reflective surface of one or more of the reflective optical elements 92 via thermally inducing a deformation of the body of a relevant one(s) of the reflective optical elements 92.

In some embodiments of the invention, the controller 98 may be operable to implement a feedforward or model based control. For example, in some embodiments, the controller 98 may be operable to control the thermal actuation systems 110 in dependence on a known or expected usage of the fourth system 112, as now discussed.

It will be appreciated that when the fourth system 112 is operating and the radiation beam 118 is propagating through the fourth system 112 each of the reflective optical elements 92 will receive a heat load from the radiation beam and therefore the reflective optical surfaces of the reflective optical elements 92 may be distorted. Furthermore, this distortion may be different, for example, just after the fourth system 112 becomes operational and after the fourth system 112 has been operational for a significant amount of time.

For example, the fourth system 112 described with reference to FIG. 9 may form part of the laser system 1 and/or a beam delivery system for delivering the laser beam 2 from the laser system 1 to the radiation source SO. When the expected usage of the fourth system 112 is known then feedforward-based or model-based control can be implemented by the controller 98. It will be appreciated that the expected usage of the fourth system 112 may be dependent on a plurality of different parameters of the radiation source SO and/or lithographic apparatus LA such as, for example, exposure durations; on-off droplet times of the fuel emitter 3; the start of a lot; the start of the exposure of a first die or target region of a substrate; and the start of the laser 1. For example, it may be known that during the exposure of a first die or target region of a substrate W there is typically a known focus drift. This known behavior can be feedforward controlled, using the controller 98 to control the thermal actuation systems 110 of the reflective optical elements 92, to reduce or minimize this drift. Advantageously, this can reduce the risk of imaging errors and/or loss of throughput of the lithographic apparatus LA. As another example, upon start of the laser 1, it may be known that the laser beam 2 typically shows a known drift during an initial time period. This known behavior can also be feedforward-controlled, using the controller 98 to control the thermal actuation systems 110 of the reflective optical elements 92, to compensate for this. To this end, the context information representative of the expected usage is supplied to the controller 98 via the input 99

For completeness it is remarked here that any of the optical reflective elements 64 in FIG. 6, 74 and 76 in FIG. 7, and 92 in FIGS. 8 and 9 preferably also comprises the first thermal conditioning mechanism that serves to extract the heat generated in the reflective optical element as a result of absorption of part of the radiation beam incident on the reflective surface of the reflective optical element. As mentioned above, an embodiment of the first thermal conditioning mechanism includes, for example, the channels 26 as depicted in FIGS. 2, 3a-3f, that are configured for flowing a cooling fluid through the body of the relevant reflective optical element.

Figure 10:
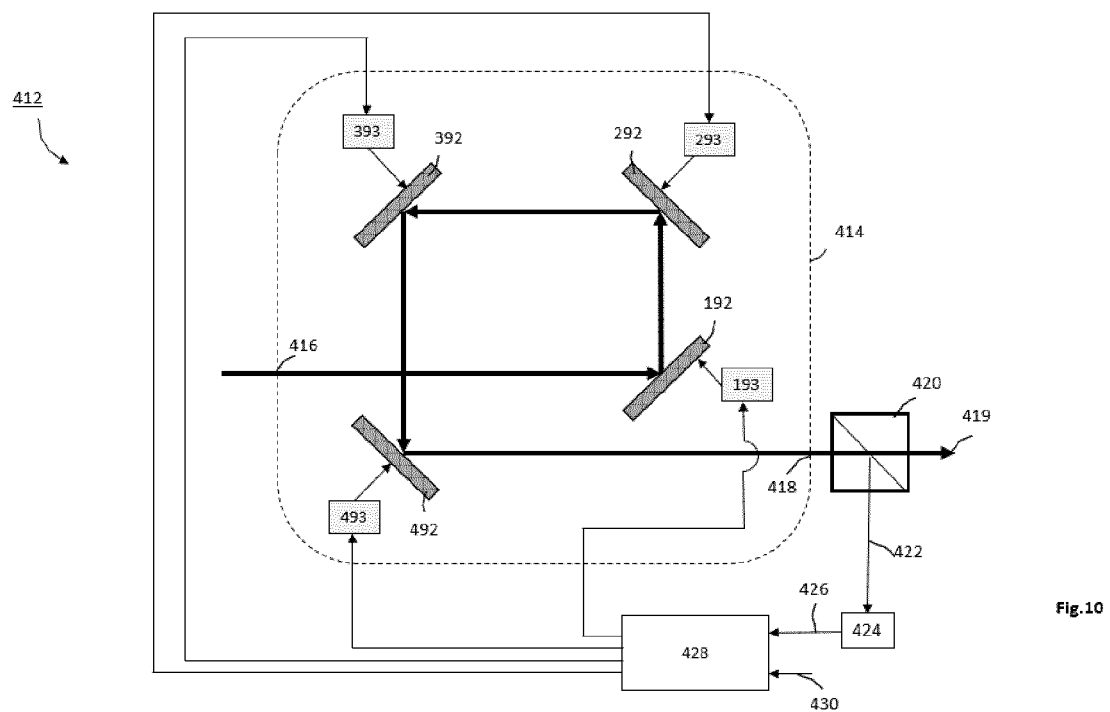
FIG. 10 illustrates a fifth system according to the invention.

FIG. 10 illustrates a fifth system 412 in the invention, wherein the thermally induced deformation is applied to a power amplifier 414 of a drive laser. As known, the laser system 1 in the diagram of FIG. 1 is also referred to as "drive laser" The drive laser 1 includes a seed laser (not shown), and an amplifier chain (not shown) that comprises a pre-amplifier and one or more power amplifiers. The seed laser is configured to produce laser pulses that are low-power. The low-power pulses get amplified by a pre-amplifier so as to prepare them for being amplified by the power amplifiers. The amplifier chain then produces high-power pulses. Generally, the drive laser 1 is a carbon-dioxide (CO2) gas laser with which high-power pulses can be obtained. Accordingly, the pre-amplifier and the power amplifier(s) use carbon-dioxide as an amplifying medium.

The CO2 power amplifier 414 routes the incoming laser pulse from an input 416 through a gas mixture to an exit 418 via a set of reflective optical elements 192, 292, 392 and 492, each of the type discussed above with reference to FIGS. 2, 3a-3f. The reflective optical elements 192, 292, 392 and 492 are coupled to thermal actuation systems 193, 293, 393 and 493, respectively. Each of the thermal actuation systems is operative to thermally induce deformation of the body of the associated reflective optical element and, hence, of the reflective surface of the reflective optical element, as discussed above in detail.

For clarity, the expressions "laser beam" and "laser pulse" will be used throughout the remainder of this text as being interchangeable.

A beam splitter 420 is provided at the exit 418. The beam splitter 420 is operative to split off a small fraction 422 of the laser beam exiting the power amplifier 414. Most of the laser beam at the exit 418 propagates unimpeded via the beam splitter 420 towards a destination 419, e.g., a succeeding power amplifier or a beam delivery system guiding the laser beam towards the EUV source SO. The fraction 422 is diverted to a sensing system 424. The fraction 422 is considered representative of the amplified laser beam traveling to the destination 419. The sensing system 424 is configured to sense one or more characteristics of the fraction 424, e.g., pointing or position of the laser beam relative to some pre-determined reference, divergence or convergence, spatial intensity distribution, energy, etc. The sensing system 424 supplies a sensing signal 426 that is representative of the one or more characteristics sensed. The sensing system 424 supplies the sensing signal to a controller 428. The controller 428 processes the sensing signal 426 and generates one or more control signals for control of one or more of the thermal actuation systems 193, 293, 393 and 493. For example, the controller 428 receives reference information via an input 430 in order to determine if the characteristics sensed comply with pre-determined criterions. If the sensed characteristics do not comply with the pre-determined criterions, the reflective optical elements 192, 292, 392 and 492 are controlled via their associated thermal actuation system so as to correct the characteristics.

Accordingly, this mechanism can be used to implement, for example, a variable beam expander. Furthermore, the mechanism may be used to reduce thermal gas lensing or, in the contrary, to temporarily introduce thermal lensing. As known, in gas lasers and in amplifiers using a gas as amplifying medium, the gas heats up non-uniformly as a result of which the index of refraction of the gas medium becomes position dependent. In practice, this non-uniformity of the refractive index manifests itself as a lens implicit in the gas laser or in the amplifier. So, by thermally induced deformation of the reflective optical elements 192, 292, 392 and 492, the characteristics of the laser beam can be controlled.

Figure 11:
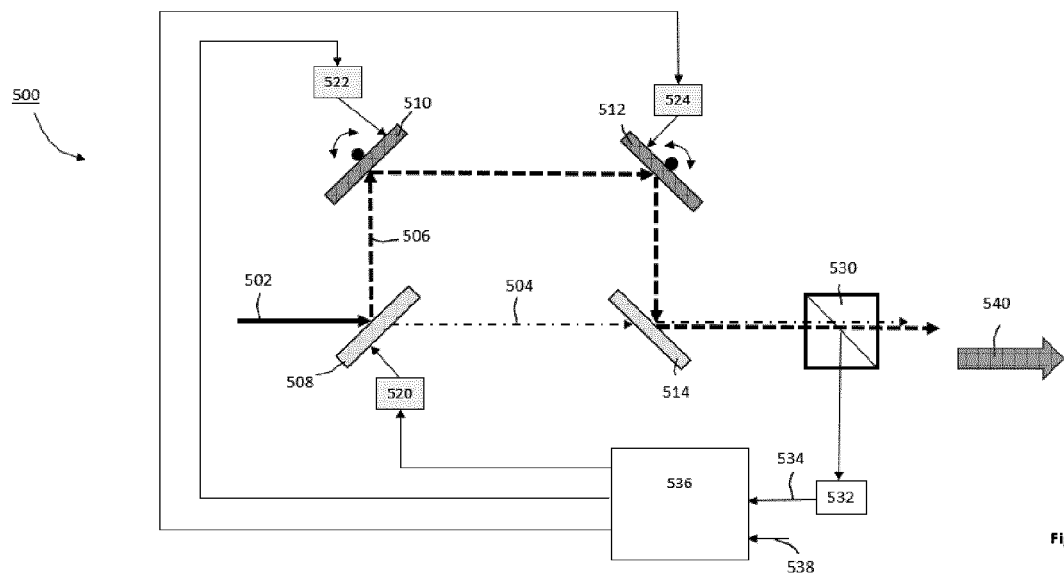
FIG. 11 illustrates a sixth system according to the invention.

FIG. 11 illustrates a sixth system 500 according to the invention. In a laser-produced plasma (LPP) radiation source SO of the type shown in FIG. 1, the laser system 1 may be arranged to irradiate a fuel target (for example in the form of a fuel droplet) with two or more laser pulses. First, one or more low-power pre-pulses may be incident on the fuel target so as to condition the fuel target for receipt of the high-power main pulse that produces the actual plasma. The laser system 1 may use different $CO_2$ seed lasers to produce the different laser pulses. Consider the case wherein a single pre-pulse and a single main pulse are being used per single fuel target. The different laser pulses follow a common path through the amplifier chain. The pre-pulse and the main pulse have slightly different wavelengths so that their paths can be separated downstream of the amplifier chain, e.g., via dichroic mirrors. Separation of the paths enables to optimize the beam shapes of the pre-pulse and of the main pulse independently and to control the positions of the focus of the pre-pulse and of the focus of the main pulse independently.

More specifically, the sixth system 500 is configured to receive the pre-pulse and the main pulse from a common path 502 and to provide a first path 504 for the pre-pulse and a second path 506 for the main pulse. The sixth system 500 comprises a first reflective optical element 508, a second reflective optical element 510, a third reflective optical element 512 and a fourth reflective optical element 514. The first reflective optical element 508 is a dichroic mirror. As known, a dichroic mirror is an optical device operative to selectively pass radiation having wavelengths in a small band, and to reflect other radiation. In the system 500, the dichroic mirror 508 is operative to pass the pre-pulse and to reflect the main pulse. The pre-pulse then propagates to the fourth reflective optical element 514 that is another dichroic mirror configured to pass the pre-pulse. The second reflective optical element 510 and the third reflective optical element 512 define the path of the main pulse towards the dichroic mirror 514. The dichroic mirror 514 reflects the main pulse. The orientations of the second reflective optical element 510 and of the fourth reflective optical element 512 are adjustable so as to be able to control the position of the main pulse focus in a plane perpendicular to the propagation direction. The position of the pre-pulse focus is adjustable via other reflective optical elements (not shown) upstream of the sixth system 500.

The sixth system 500 further includes a beam splitter 530 that splits-off a small fraction of the pre-pulse and/or a small fraction of the main pulse and that directs these small fractions to a sensing system 532. The remainder of the pre-pulse and the remainder of the main pulse propagate in the direction 540 towards the fuel target (not shown). The sensing system 532 is operative to sense one or more characteristics of the small fraction of the pre-pulse and/or of the small fraction of the main pulse. The characteristics sensed of the small fractions are considered representative of the characteristics of the remainder of the pre-pulse and of the remainder of the main pulse propagating towards the fuel target. Examples of the one or more characteristics sensed are: a spatial intensity distribution of the radiation forming the pre-pulse or forming the main pulse; divergence or convergence of the radiation; the shape of the wavefront of the radiation, etc. The sensing system 532 supplies to a controller 536 an output signal 534 representative of the characteristics sensed.

The controller 538 is configured to control operation of a thermal actuation system 520, a thermal actuation system 522 and a thermal actuation system 524 in dependence on the output signal 534 received from the sensing system 532 and, optionally, in dependence on a signal 538 representing a reference. The thermal actuation system 520 is operative to thermally induce a deformation of the body of the dichroic mirror 508. The thermal actuation system 522 is operative to thermally induce a deformation of the body of the reflective optical element 510. The thermal actuation system 522 is operative to thermally induce a deformation of the body of the reflective optical element 510. As discussed above with reference to FIG. 2 and FIGS. 3a-3f, any of the thermal actuation systems 520, 522 and 524 may include one or more thermo-electric devices, and/or one or more lasers for irradiating the body of the relevant reflective optical element, and or one or more additional conduits for flowing a fluid through the body, the fluid's temperature determining the thermally induced deformation. Accordingly, the characteristics of the main pulse and of the pre-pulse can be independently controlled through thermal actuation of the reflective optical elements 508, 510 and 512.

As illustrated above, the system according to the present invention may advantageously be implemented in a laser system or beam delivery system of a laser beam, in order to control a characteristic of the laser beam. In particular, the system according to the present invention may advantageously be applied in a laser system or beam delivery system for an LPP radiation source such as an EUV radiation source. As described above, e.g. with reference to FIGS. 9-11, such a laser system 1 may be provided with one or more systems according to the invention.

In the embodiment of the present invention as illustrated in FIG. 10, a power amplifier of a laser is described which can be provided with one or more reflective optical elements 192, 292, 392 and 492, each of the type discussed above with reference to FIGS. 2, 3a-3f. The reflective optical elements 192, 292, 392 and 492 are coupled to thermal actuation systems 193, 293, 393 and 493, respectively. Each of the thermal actuation systems is operative to thermally induce deformation of the body of the associated reflective optical element and, hence, of the reflective surface of the reflective optical element. In a similar manner, a beam delivery system which is configured to deliver a laser beam, e.g. generated by a laser system 1, to an LPP radiation source, may be equipped with one or more reflective optical elements as well, whereby said one or more reflective optical elements may be coupled to a thermal actuation system as discussed above. The use of a thermal actuation system, either in a power amplifier of a laser or a beam delivery system, enables a control of a laser beam characteristic such as the wavefront of the laser beam or the position or the orientation of the laser beam.

When such a laser is used as a drive laser for a laser-produced plasma (LPP) radiation source SO of the type shown in FIG. 1, the laser beam that is used to interact with the fuel target needs to meet certain required characteristics, in order to ensure a proper generation of the EUV radiation. In order to ensure that the required characteristics are maintained during the exposure process of the lithographic apparatus that uses the LPP source, the laser or driver laser is typically used in a continuous mode. This means that the laser is typically not turned off when no EUV radiation is needed. In particular, the laser system 1 as applied is typically used to continuously generate a (high frequency) sequence of laser pulses, irrespective of whether or not EUV radiation needs to be generated by the LPP radiation source. In particular, no EUV radiation is needed during the time between the end of an exposure of a target area (i.e. a die) on a substrate and the start of the exposure of a subsequent target area. Similarly, no EUV radiation is needed when a substrate exchange occurs. Such a substrate exchange occurs once all target areas on a substrate have been exposed; the exposed substrate is transported out of the apparatus and a next substrate is arranged for exposure by the patterned radiation beam, e.g. a patterned EUV radiation beam.

At present, known lasers or drive lasers as applied in LPP radiation sources are thus operated in a continuous mode, while there is no continuous need to generate EUV radiation. Considering that the electrical power requirements of a drive laser as applied in an LPP radiation source are substantial, e.g. several hundreds of kW, it would be beneficial, from an energy consumption perspective, to operate the drive laser in a discontinuous mode. Substantial energy savings could be realized when the drive laser of an LPP radiation source would be operated in a discontinuous mode, rather than in a continuous mode.

As the system according to the invention enables to control a characteristic of the laser beam as generated by the laser system 1, it enables a more flexible use of the laser system 1.

Figure 12:
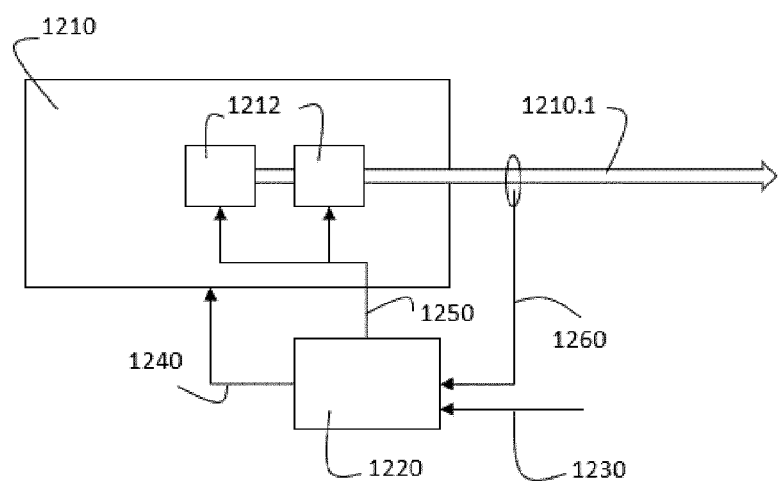
FIG. 12 illustrates a seventh system according to the invention.

As such, in an embodiment of the present invention, a laser system for use in an LPP radiation source is provided which may be configured to operate in a discontinuous manner. FIG. 12 schematically shows such a seventh system according to the invention. The seventh system according to the invention may e.g. comprise the system 112 of FIG. 9, the system 412 of FIG. 10 or the system 500 of FIG. 11, or a combination thereof.

In the embodiment as shown, the LPP radiation source 1200 comprises a laser system 1210, which may be a laser system 1 as shown in FIG. 1, that is configured to generate a radiation beam 1210.1, e.g. to perform a lithographic exposure process. The laser system 1210 of the LPP radiation source 1200 as shown comprises one or more systems 1212 according to the present invention, said systems 1212 being configured to control a shape of an optical element of the laser system 1210, as e.g. discussed above. The LPP radiation source 1200 further comprises a controller 1220 that is configured to control the laser system 1210. In an embodiment, the controller 1220 may e.g. be configured to receive an input signal 1230 representative a radiation requirement, e.g. a radiation requirement for a lithographic apparatus applying the LPP radiation source 1200. Based on said input signal 1230, the controller 1220 may e.g. control the laser system 1210 to generate the required sequence of laser pulses in order to generate the radiation that meets the radiation requirement for the lithographic apparatus. Reference number 1240 may thus refer to a control signal as generated by the controller 1220, the control signal 1240 being configured to control the laser system 1210 in accordance with the input signal 1230.

In addition, the controller 1220 may be configured to control, based on the input signal 1230, the one or more systems 1212 according to the invention that are applied in the laser system 1210 of the LPP source 1200. In particular, the controller may be configured to control the system or systems 1212 according to the present invention that are applied in the laser system 1210 in such manner that the laser beam 1210.1 as generated meets a desired or required characteristic. Reference number 1250 may thus refer to a control signal as generated by the controller 1220, the control signal 1250 being configured to control the one or more systems 1212 in such manner that the laser beam 1210.1 as generated meets the desired or required characteristic. In order to do so, the controller 1220 may e.g. be configured to receive a beam characteristic signal 1260, the beam characteristic signal 1260 representing a measured characteristic of the laser beam 1210.1 as generated by the laser system 1210. Said signal 1260 may e.g. be applied by the controller 1220 as a feedback signal to control the one or more systems 1212 as applied in the laser system 1210. Alternatively, or in addition, the control unit 1220 can make use of a mathematical model, e.g. a thermal model, or empirical data to generate the control signal 1250 to control the one or more systems 1212.

As the system, e.g. system 1212, enables a control of the characteristic of the laser beam by controlling a shape of an optical element of the laser system 1210, the system 1212 enables to operate the laser system 1210 in a discontinuous manner rather than a substantially continuous manner. By using the system according to the present invention, the effect of thermal, or any other laser ON/OFF related transients on the laser beam characteristics can be anticipated or controlled. As such, there is no need to operate the laser system 1210 as applied in the LPP radiation source 1200 in a continuous mode. Using the system according to the present invention in a laser system 1210 of an LPP radiation source 1200 thus enables or allows the laser system to operate in a discontinuous mode. The laser system 1210 may e.g. be turned off in between the exposure sequence of two consecutive substrates of a lot of substrates or in between the exposure sequence of two different lots of substrates. By doing so, substantial energy savings may be realized.

For completeness it is also remarked here that in certain implementations of a system according to the invention, a separate first thermal conditioning system may not be needed. As already explained, the first thermal conditioning system is configured to extract the heat from the reflective optical element that is caused by absorption of a part of the radiation beam incident on the reflective surface. The second thermal conditioning system, on the other hand, is configured to control a shape of the reflective surface via thermally inducing a deformation of the body of the reflective optical element under control of a controller. If the heat generated by absorption is low, dedicated hardware in the form of the first thermal conditioning mechanism may not be needed. Alternatively, if the heat generated by absorption is high, heat extraction may be accomplished by having the first thermal conditioning mechanism and the second thermal conditioning system at least partly implemented by the same hardware. That is, a system according to the invention comprises at least one thermo-electric element configured to implement at least partly the first thermal conditioning mechanism as well as to implement at least partly the second thermal conditioning mechanism. For example, a set of thermo-electric elements may be controlled so as to extract the heat caused by absorption of the radiation beam incident on the reflective surface of the reflective optical element. The heating or cooling by means of a thermo-electric element depends on a direction of an electric current through the thermo-electric element. The amount of heating or cooling depends on a magnitude of the electric current. Therefore, in order to extract the heat, the thermo-electric elements receive certain currents. In a steady state, these currents are steady as well and the body of the reflective optical element assumes a form associated with a first thermal equilibrium. Now, if the magnitude of a particular current is increased or decreased with respect to the magnitude assumed in the first thermal equilibrium, a new thermal equilibrium will emerge, wherein the reflective optical element assumes another form. In other words, changing the magnitudes of the currents gives rise to changes in the shape of the reflective surface.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin film magnetic heads, etc.

Although specific reference may be made in this text to embodiments of the invention in the context of a lithographic apparatus, embodiments of the invention may be used in other apparatus. Embodiments of the invention may form part of a mask inspection apparatus, a metrology apparatus, or any apparatus that measures or processes an object such as a wafer (or other substrate) or mask (or other patterning device). These apparatus may be generally referred to as lithographic tools. Such a lithographic tool may use vacuum conditions or ambient (non-vacuum) conditions.

Where the context allows, embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic storage media; optical storage media; flash memory devices; electrical, optical, acoustical or other forms of propagated signals (e.g. carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc. and in doing that may cause actuators or other devices to interact with the physical world.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

The invention claimed is:

1. A system for directing a radiation beam, the system comprising:
   a reflective optical element comprising a body defining a reflective surface configured to receive and partially reflect the radiation beam;
   a first thermal conditioning mechanism;
   a second thermal conditioning mechanism; and
   a controller;
   wherein:
      the first thermal conditioning mechanism is configured to transport away from a first portion of the body heat generated by partial absorption of the radiation beam by the reflective optical element;
      the second thermal conditioning mechanism is configured to control, under control of the controller, a shape of the reflective surface via thermally inducing a deformation of a second portion of the body; and
      the second portion has a lower thermal conductivity than the first portion.

2. The system of claim 1, wherein the first thermal conditioning mechanism comprises at least a first channel in the body configured to transport a first cooling fluid through the body.

3. The system of claim 1, wherein the second thermal conditioning mechanism comprises at least one of:
   a conduit in the body configured to transport a thermal conditioning fluid through the body;
   a thermo-electric element; and
   a light source operative to irradiate at least a part of a surface of the body.

4. The system of claim 1, wherein:
   the body of the reflective optical element has a side other than adjacent the reflective surface;
   the side of the body has a non-flat profile when the body is not subjected to the thermally induced deformation; and
   the side is configured to co-determine the thermally induced deformation of the body.

5. The system of claim 1, further comprising a sensing system configured to sense a characteristic of at least one of:
   the radiation beam incident on the reflective optical element; and
   the reflected radiation beam;
   wherein the sensing system is configured to provide to the controller an output signal representative of the characteristic sensed.

6. The system of claim 1, comprising at least one thermo-electric element configured to implement at least partly the first thermal conditioning mechanism as well as to implement at least partly the second thermal conditioning mechanism.

7. The system of claim 1, disposed in a laser system.

8. The system of claim 1, disposed in an optical amplifier system.

9. The system of claim 1, disposed in a beam delivery system configured to guide a laser beam to a fuel target for creating a plasma.

10. The system of claim 1, disposed in a beam expander system.

11. The system of claim 1, disposed in a beam compressor system.

12. A separation system, wherein:
the separation system is configured to receive, at a common input, a first laser beam of a first wavelength and a second laser beam of a second wavelength different from the first wavelength;
the separation system is configured to provide a first path through the separation system for the first laser beam, and a second path through the separation system for the second laser beam that is different from the first path; and
the separation system further comprises the system of claim 1.

13. The separation system of claim 12, wherein the reflective optical element includes a dichroic mirror.

14. The system of claim 1, in combination with a second reflective optical element and a second thermal conditioning system.

15. The system of claim 1, disposed in a lithographic apparatus configured for imaging a pattern onto a substrate via a radiation beam.

16. A system for directing a radiation beam, the system comprising:
a reflective optical element comprising a body defining a reflective surface configured to receive and partially reflect the radiation beam;
a first thermal conditioning mechanism;
a second thermal conditioning mechanism; and
a controller;
wherein:
the first thermal conditioning mechanism is configured to transport heat away from a first portion of the body that is generated by partial absorption of the radiation beam by the reflective optical element;
the second thermal conditioning mechanism is configured to control a shape of the reflective surface via thermally inducing a deformation of a second portion of the body under control of the controller; and
the second portion has a lower thermal conductivity than the first portion; and wherein:
the body of the reflective optical element has a side other than adjacent the reflective surface;
the side of the body has a non-flat profile when the body is not subjected to the thermally induced deformation; and
the second thermal conditioning mechanism comprises one or more thermo-electric elements and is configured to co-determine the thermally induced deformation of the body.

* * * * *